(12) United States Patent
Gandhi

(10) Patent No.: US 8,970,034 B2
(45) Date of Patent: Mar. 3, 2015

(54) SEMICONDUCTOR ASSEMBLIES AND STRUCTURES

(75) Inventor: Jaspreet S. Gandhi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/467,465

(22) Filed: May 9, 2012

(65) Prior Publication Data

US 2013/0299965 A1  Nov. 14, 2013

(51) Int. Cl.
*H01L 23/48* (2006.01)
(52) U.S. Cl.
USPC .......................................... 257/737; 438/116
(58) Field of Classification Search
CPC . H01L 24/15; H01L 24/10; H01L 2225/1058; H01L 2225/06513
USPC .................................. 438/618, 613; 257/737
See application file for complete search history.

(56) References Cited

U.S. PATENT DOCUMENTS

| | | |
|---|---|---|
| 3,827,918 A | 8/1974 | Ameen et al. |
| 5,773,889 A | 6/1998 | Love et al. |
| 5,957,736 A | 9/1999 | Moriuchi et al. |
| 6,143,641 A | 11/2000 | Kitch |
| 6,510,976 B2 | 1/2003 | Hwee et al. |
| 6,869,873 B2 | 3/2005 | Bradshaw et al. |
| 7,182,807 B2 | 2/2007 | van Ooij et al. |
| 7,183,139 B2 | 2/2007 | Jayaraman et al. |
| 7,241,689 B2 | 7/2007 | Kim et al. |
| 7,273,812 B2 | 9/2007 | Kim et al. |
| 7,279,223 B2 | 10/2007 | Rubinsztajn et al. |
| 7,327,039 B2 | 2/2008 | Charles et al. |
| 7,332,822 B2 | 2/2008 | Basheer et al. |

(Continued)

FOREIGN PATENT DOCUMENTS

| | | |
|---|---|---|
| EP | 1508261 B1 | 9/2010 |
| JP | 94053249 B2 * | 7/1994 |

(Continued)

OTHER PUBLICATIONS

Carano et al., Next Generation Organic Solderability Preservatives (OSP) for Lead-Free Soldering and Mixed Metal Finish PWBs and BGA Substrates, The Board Authority (2005) pp. 48-52.

(Continued)

*Primary Examiner* — Thao X Le
*Assistant Examiner* — Laura Dykes
(74) *Attorney, Agent, or Firm* — TraskBritt

(57) ABSTRACT

Semiconductor assemblies, structures, and methods of fabrication are disclosed. A coating is formed on an electrically conductive pillar. The coating, which may be formed from at least one of a silane material and an organic solderability protectant material, may bond to a conductive material of the electrically conductive pillar and, optionally, to other metallic materials of the electrically conductive pillar. The coating may also bond to substrate passivation material, if present, or to otherwise-exposed surfaces of a substrate and a bond pad. The coating may be selectively formed on the conductive material. Material may not be removed from the coating after formation thereof and before reflow of the solder for die attach. The coating may isolate at least the conductive material from solder, inhibiting solder wicking or slumping along the conductive material and may enhance adhesion between the resulting bonded conductive element and an underfill material.

16 Claims, 8 Drawing Sheets

(56) References Cited

U.S. PATENT DOCUMENTS

| | | | |
|---|---|---|---|
| 7,363,705 B2 | 4/2008 | Kim et al. | |
| 7,412,767 B2 | 8/2008 | Kim et al. | |
| 7,470,564 B2 | 12/2008 | Shi et al. | |
| 7,482,201 B2 | 1/2009 | Charles et al. | |
| 7,667,473 B1 | 2/2010 | Conn et al. | |
| 7,927,925 B2 | 4/2011 | Chakrapani et al. | |
| 7,994,249 B2 | 8/2011 | van Ooij et al. | |
| 8,018,073 B2 | 9/2011 | Chakrapani et al. | |
| 2002/0092610 A1* | 7/2002 | Funaya et al. | 156/273.3 |
| 2003/0151140 A1 | 8/2003 | Nishiyama et al. | |
| 2004/0094842 A1 | 5/2004 | Jimarez et al. | |
| 2005/0110164 A1 | 5/2005 | Pendse | |
| 2006/0115927 A1 | 6/2006 | Yeo et al. | |
| 2006/0278999 A1* | 12/2006 | Hsu et al. | 257/778 |
| 2007/0267745 A1* | 11/2007 | Chao et al. | 257/737 |
| 2007/0278002 A1 | 12/2007 | Mayder et al. | |
| 2007/0284706 A1 | 12/2007 | Cherian | |
| 2008/0026505 A1 | 1/2008 | Chakrapani | |
| 2008/0067502 A1 | 3/2008 | Chakrapani et al. | |
| 2008/0108180 A1 | 5/2008 | Charles et al. | |
| 2008/0108221 A1 | 5/2008 | Kim et al. | |
| 2009/0233436 A1* | 9/2009 | Kim et al. | 438/614 |
| 2010/0155253 A1 | 6/2010 | Kim et al. | |
| 2010/0190302 A1 | 7/2010 | Chakrapani et al. | |
| 2010/0300743 A1 | 12/2010 | Bchir et al. | |
| 2011/0163445 A1 | 7/2011 | Chakrapani et al. | |
| 2011/0266667 A1 | 11/2011 | Wu et al. | |
| 2011/0285011 A1* | 11/2011 | Hwang et al. | 257/737 |
| 2011/0291146 A1 | 12/2011 | Fay et al. | |
| 2011/0298123 A1* | 12/2011 | Hwang et al. | 257/737 |

FOREIGN PATENT DOCUMENTS

| | | |
|---|---|---|
| WO | 2008057931 A1 | 5/2008 |
| WO | 2010141624 A2 | 12/2010 |

OTHER PUBLICATIONS

Gandhi, Jaspreet Singh, Electrodeposition of Organofunctional Silanes for Improved Corrosion Protection of Metals, University of Cincinnati, Oct. 14, 2004.

IBM, Copper Pillar Sidewall Wetting Prevention—Structure and Process, IP.com PriorArtDatabase, Technical Disclosure, Apr. 29, 2009, 6 pages.

Sun et al., Novel OSP Coatings for Lead-Free Processes, circuitree. com, Mar. 2006, pp. 30-34.

* cited by examiner

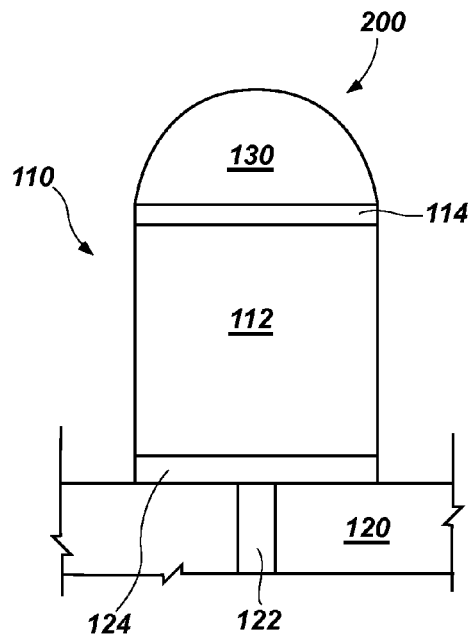
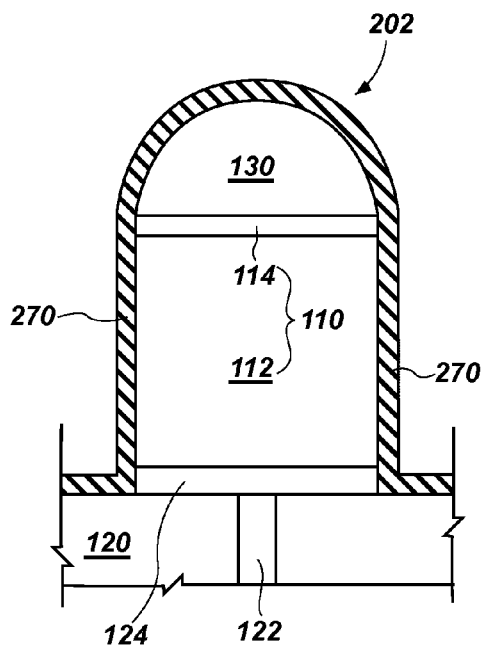
FIG. 2A        FIG. 2B
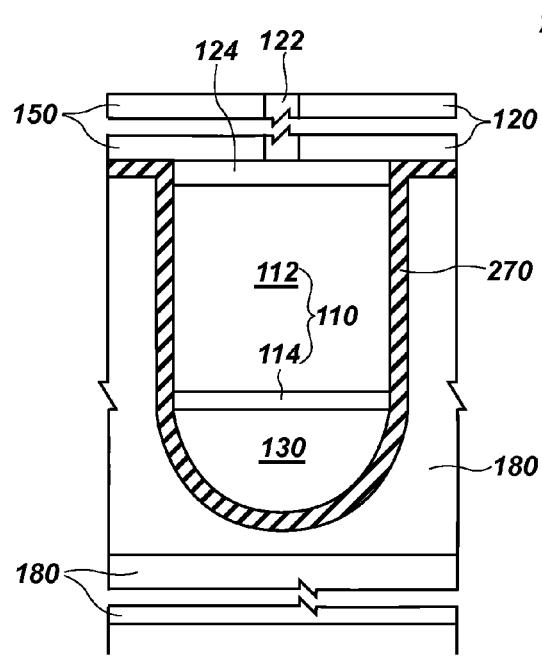
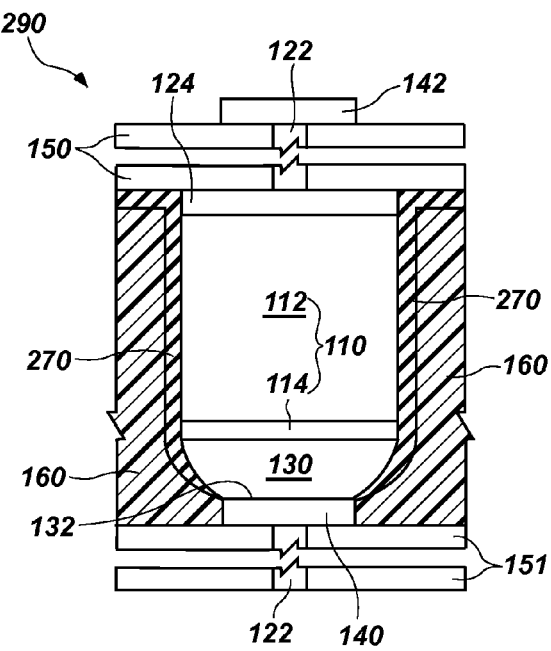
FIG. 2C        FIG. 2D

SEMICONDUCTOR ASSEMBLIES AND STRUCTURES

TECHNICAL FIELD

The present disclosure, in various embodiments, relates generally to semiconductor structures, such as semiconductor die assemblies, and to methods of fabrication of the assemblies and structures.

BACKGROUND

Processed semiconductor dice containing integrated circuits may be electrically and physically connected with other semiconductor dice, semiconductor dice in wafer or partial wafer form, interposers, circuit boards, and other higher-level packaging, any such structures hereinafter collectively referred to as "substrates," to operably connect the integrated circuits on the semiconductor die with those on another substrate. This connection may use a large number of electrically conductive elements protruding from a major surface, such as the active surface or a backside surface, of the semiconductor die or semiconductor dice in wafer or partial wafer form. The conductive elements may comprise an electrically conductive bump, stud, column, or pillar, which may in some instances be in the form of a cylindrical structure. The conductive element may reside on a conductive pad, referred to in the art as a "bond pad," on an active surface of the semiconductor substrate.

To accomplish the electrical and physical interconnection, the semiconductor die, which may be included in a wafer or partial wafer form, may be inverted, i.e., flipped upside down, and bonded to another conductive material, referred to in the art as a "landing pad," on another substrate. Bonding, which may be effected using a solder material that is melted and then solidified, is accomplished during a processing stage known as "die attach." Thus, during die attach, the semiconductor die, which may be referred to in the art as "die one," is electrically and physically interconnected with the substrate, which, if the substrate comprises the base semiconductor die of a stacked die assembly, may be referred to as "die zero." Multiple such dice may be stacked upon one another in this manner to form a stacked semiconductor die assembly. If the semiconductor die was in a wafer form during die attach, the wafer may be singulated to form individual or groups of processed semiconductor dice.

As noted above, a solder material may be used to accomplish the die attach. The solder material may be in the form of solder mass, also known in the art as a "solder ball" or a "solder bump," supported by another material of the conductive element or directly by a bond pad. During die attach, the solder may be reflowed in proximity with the conductive element and the landing pad, optionally in the presence of a flux material.

Before or during reflow of the solder, during die attach, during die stacking, during subsequent processing, or any combination thereof, the solder may slump, or even wick, along the periphery of a supporting material of the electrically conductive element. Either or both of solder slumping or wicking may lead to undesirable formation of intermetallic materials due to reaction between one or more materials within the solder and one or more materials within the supporting material of the conductive element. For example, conventional conductive elements may include a conductive material, e.g., copper, which may react and form an intermetallic material with a material of a conventional solder material used for die attach, e.g., tin, disposed over the conductive material, for example, at an end of the conductive element. Growth of such a copper-tin intermetallic material may proceed at a significant pace, leading to deterioration of the conductive pillar and potential formation of Kirkendall voids within the conductive element. The formation of the intermetallic material can cause problems during temperature cycling testing and high-temperature storage testing as well as during operation of the semiconductor dice employing the conductive elements.

Solder wicking or slumping can also leave an insufficient volume of solder disposed between the conductive element and the landing pad, weakening the strength of the bond. Substantial solder wicking or slumping can lead to failure of the joint between the conductive element and landing pad.

Conventional conductive elements may include a conductive barrier material disposed between the conductive material of the conductive element and the region of the conductive element in contact with the solder material during solder reflow and die attach. The barrier material may, at least initially, prevent direct contact between the conductive material and the solder. However, the presence of the barrier material does not necessarily inhibit the solder from slumping or wicking along the sides of the electrically conductive element and undesirably coming into contact with the conductive material of the conductive element. Therefore, use of a barrier material on the conductive element may not, by itself, sufficiently inhibit solder wicking and slumping, formation of intermetallic materials, bond weakness, or joint failure.

BRIEF DESCRIPTION OF THE DRAWINGS

FIGS. 2A through 2D are cross-sectional elevation views of a semiconductor structure of a pillar-on-pad configuration during various stages of a bonding method according to an embodiment of the present disclosure.

DETAILED DESCRIPTION

Figure 1A:
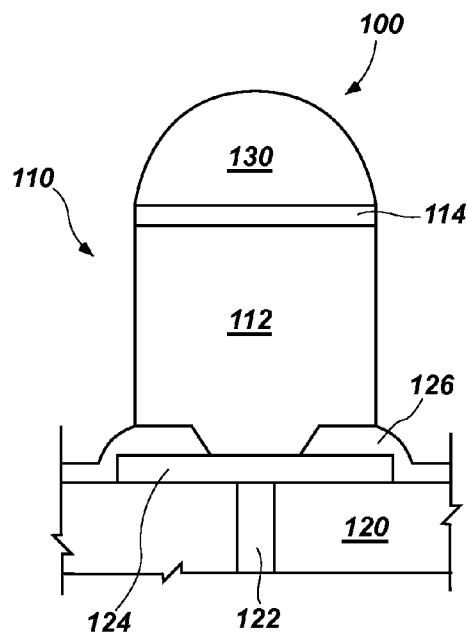
FIGS. 1A through 1D are cross-sectional elevation views of a semiconductor structure of a pillar-on-passivation configuration during various stages of a bonding method according to an embodiment of the present disclosure.

Methods of forming semiconductor die assemblies and semiconductor structures are disclosed. Semiconductor die assemblies and semiconductor structures are also disclosed. The devices and assemblies include conductive elements having a coating thereon. More specifically, the conductive elements include an electrically conductive material on which the coating is formed. The coating may, optionally, be formed over other materials disposed on the conductive element. The coating isolates the conductive material from a solder material used to bond the conductive element to inhibit the solder from wicking, or slumping, and coming into contact with the conductive material.

A precursor composition used to form the coating, which composition is referred to herein as the "coat-forming composition," may be formulated to cover the otherwise-exposed surfaces of the conductive element, which may be configured as a pillar, including the conductive material, as well as other otherwise-exposed surfaces of the conductive element. Such a coat-forming composition may include, for example, a silane material. Alternatively, the coating may be formed from a material that is selective for the conductive material of the conductive element so as to form the coating essentially only on otherwise-exposed surfaces of the conductive material of the conductive element.

After formation of the coating and, in some embodiments, without first removing material from the coating, solder may be reflowed in proximity to the conductive material of the conductive element to electrically and physically connect the conductive element with another conductive material, such as a landing pad of a substrate. The coating may passivate the conductive material, isolating it from a solder material used during die attach. The coating inhibits the solder material from coming into contact with the coated materials, e.g., the conductive material, such that the solder is inhibited from wicking or slumping along at least the conductive material of the electrically conductive pillar. Therefore, the likelihood of die collapse, intermetallic formation, and joint failure is decreased relative to the likelihood of such events occurring with bond joints employing conventional, non-passivated conductive elements. The coating may also inhibit corrosion of the coated components and may improve adhesion between the coated structures and an underfill material disposed between adjacent components of the resulting assembly, contributing to the environmental and mechanical stability of the assembly.

As used herein, the term "semiconductor substrate" means and includes a base material or construction upon which components, such as those of memory cells and peripheral circuitry, as well as logic, are formed. The semiconductor substrate may be a substrate wholly of a semiconductor material, a base semiconductor material on a supporting structure, or a semiconductor substrate having one or more materials, structures, or regions formed thereon. The semiconductor substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "semiconductor substrate" in the following description, previous process stages may have been utilized to form materials, regions, or junctions, as well as connective elements such as lines, plugs, and contacts, in the base semiconductor structure or foundation, such components comprising, in combination, integrated circuitry.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, flipped, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

Embodiments are described herein with reference to the illustrations. The illustrations presented herein are not meant to be actual views of any particular material, component, structure, device, or system, but are merely idealized representations that are employed to describe embodiments of the present disclosure. Variations from the shapes of the illustrations as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor structures. Preceding, intermediary, and final process stages are known to those of ordinary skill in the art. Accordingly, only the methods and semiconductor structures necessary to understand embodiments of the present devices and methods are described herein.

Unless the context indicates otherwise, the materials described herein may be formed by any conventional technique including, but not limited to, dip coating, spin coating, spray coating, blanket coating, chemical vapor deposition ("CVD"), plasma enhanced CVD, atomic layer deposition ("ALD"), plasma enhanced ALD, or physical vapor deposition ("PVD"). Alternatively, the materials may be grown in situ, unless the context otherwise indicates. Depending on the specific material to be formed, the technique for applying, depositing, growing, or otherwise forming the material may be selected by a person of ordinary skill in the art.

Reference will now be made to the drawings, where like numerals refer to like components throughout. The drawings are not necessarily to scale.

While various embodiments of the disclosure are described in detail with reference to a single conductive element and passivation and subsequent bonding thereof to another conductive structure, such description is merely for clarity and convenience, as in practice a large number, which may reach tens of thousands, of such conductive elements are present on a bulk semiconductor substrate such as a semiconductor wafer, including hundreds if not thousands of unsingulated semiconductor dice thereon. Each semiconductor die, in turn, has a number of conductive elements formed on and protruding from a major surface, such as an active surface, of the semiconductor substrate.

FIG. 1A illustrates a conductive element 100 employed in a configuration referred to herein as a "pillar-on-passivation" configuration. The conductive element 100 includes an electrically conductive pillar 110 that includes a conductive material 112 and a barrier material 114. The conductive material 112 may include copper. For example, without limitation, the conductive material 112 may consist essentially of copper. The conductive material 112 may, for example, have a thickness (e.g., height) between about 1 micron and about 25 microns, e.g., 15 microns. The barrier material 114 may include nickel. For example, without limitation, the barrier material 114 may consist essentially of nickel. The barrier material 114 may, for example, have a thickness between about 1 micron and about 25 microns, e.g., 3 microns.

The electrically conductive pillar 110 may be supported by a bond pad 124. The bond pad 124 is, optionally, in operable communication with another electrically conductive element, such as electrically conductive via 122, which may be in operable communication with integrated circuitry formed on or in semiconductor substrate 120, from which the electrically conductive pillar 110 extends, in operable communication with the electrically conductive via 122 extending through semiconductor substrate 120 to an opposing side thereof, or both. Bond pad 124 may be in direct communication with integrated circuitry of semiconductor substrate 120, and, in some embodiments, the electrically conductive via 122 may not be present.

According to the pillar-on-passivation configuration illustrated, a substrate passivation material 126, such as a polyimide material, may be formed over the bond pad 124 and the semiconductor substrate 120. Openings may be defined in the substrate passivation material 126 to allow physical contact between the conductive material 112 of the electrically conductive pillar 110 and the bond pad 124. In such a configuration, the electrically conductive pillar 110 is in contact with only a portion of the bond pad 124 and the substrate passivation material 126 covers otherwise-exposed surfaces of the bond pad 124 and the substrate 120.

A mass of solder 130 may be supported by the electrically conductive pillar 110 and may be separated from the conductive material 112 by the barrier material 114. The solder 130 may be a eutectic composition of tin and silver, e.g., a tin-silver solder material, and may have a thickness (e.g., height) of about 15 microns before reflow.

The solder 130 may, optionally, be reflowed, prior to die attach, for example, by heating the solder 130 above its melting point, optionally in the presence of flux. Treating the solder 130 with flux may enhance reflow of the solder 130, e.g., by discouraging oxidation of the solder 130 during reflow, by acting as a wetting agent, and by reducing surface tension of reflowed (i.e., melted) solder 130 to increase its flowability. The pre-die-attach reflow may provide a mass of solder 130 of a rounded shape, as illustrated in FIG. 1A.

Figure 1B:
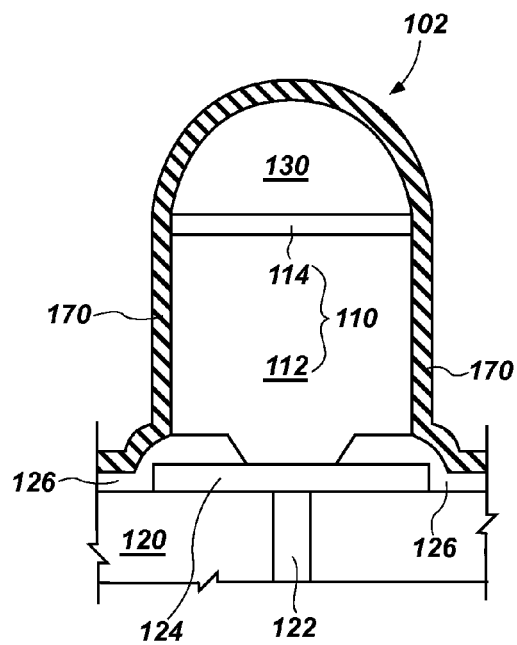

With reference to FIG. 1B, following formation of the conductive element 100 (FIG. 1A), a coating 170 may be formed on at least one of the materials of the conductive element 100. The coating 170 may be formed after the optional initial reflow of the solder 130 with or without flux, if such initial reflow is performed.

The coating 170 may be formed on the conductive element 100 by exposing the conductive element 100 to a coat-forming composition. One or more materials of the coat-forming composition, e.g., the coating material, may be reactive with one or more materials of the conductive element 100. The term "coating composition," as used herein, refers to the composition of the resulting, formed coating 170. The coat-forming composition may not necessarily be identical to the coating composition due to, e.g., chemical reaction between the coat-forming composition and the material of the conductive element 100 during formation of the coating 170.

The coat-forming composition may be formulated to form a coating on the other-wise exposed surfaces of some or all of the materials of the conductive element 100, e.g., on essentially all otherwise-exposed surfaces of the conductive element 100.

The coat-forming composition may include, for example and without limitation, a silane material. As used herein, the terms "silane" and "silane material" mean and include a chemical compound including silicon and at least one other element, e.g., carbon, hydrogen, nitrogen, sulfur, or a combination thereof. Silane materials may be formulated as non-functional silanes or as functional silanes.

As used herein, the term "non-functional silane" means a silane material reactive with metallic material of the conductive element but lacking a functional group reactive with a nonmetallic material of the conductive element. Examples of non-functional silane materials include, but are not limited to, silane compounds including the formula —Si—$(OC_2H_5)_x$, where x is an integer, and including either a methoxy or an ethoxy group. The methoxy or ethoxy group is hydrolyzable to form a silanol (i.e., a Si—OH bond), with an alcohol (e.g., methanol or ethanol) formed as a by-product.

As used herein, the term "functional silane" means a silane material reactive with metallic material of the conductive element and having a functional group reactive with a nonmetallic material of the conductive element. Examples of functional silanes include, but are not limited to, silane coupling agents. As used herein, the term "silane coupling agent" means and includes a hybrid organic-inorganic compound with the formula $(XO)_3Si(CH_2)_qY$, where XO represents a hydrolyzable alkoxy group (e.g., methoxy, ethoxy), q represents an integer, and Y represents a functional group, such as, for example and without limitation, an amino, sulfur, carboxyl, or thiol group. For example, without limitation, a functional silane material according to embodiments of the present disclosure may be an organofunctional silane with one or more of the organofunctional groups or chemical structures in Table 1, which table is not exhaustive.

TABLE 1

Example Organofunctional Groups and Example Chemical Structures

| Organofunctional Group | Example Chemical Structure |
| --- | --- |
| Vinyl | $H_2C=CHSi(OCH_3)_3$ |
| Chloropropyl | $Cl(CH_2)_3Si(OCH_3)_3$ |
| Epoxy | $\underset{CH_2CHCH_2O(CH_2)_2CH_2Si(OCH_3)_3}{\overset{O}{\triangle}}$ |
| Methacrylate | $H_2C=\underset{\underset{CH_3}{\vert}}{C}-COO(CH_2)_3Si(OCH_3)_3$ |
| Primary amine | $H_2N(CH_2)_3Si(OCH_3)_3$ |
| Diamine | $H_2N(CH_2)_2NH(CH_2)_3Si(OCH_3)_3$ |
| Mercapto | $HS(CH_2)_3Si(OCH_3)_3$ |

When a silane material, either functional or non-functional, is hydrolyzed in water, or, alternatively, in an alcohol and water mixture, silanol groups (i.e., Si—OH groups) may form. The silanol groups of the hydrolyzed coat-forming composition may be reactive with hydroxyl groups on the surface of a metal that has been exposed to oxygen and moisture. That is, exposure of a metal structure to oxygen may form metal oxides on the surface of the metal structure. Subsequent exposure of the formed metal oxides to moisture may form M-OH bonds, where M represents a metal (for example, and without limitation, Cu, Ni, Sn, Al, Ag). Thus, metal components of the conductive element 100 may include hydroxyl bonds on their surfaces. Exposure of such hydroxyl bonds to silanol groups of a hydrolyzed silane material may lead to reaction, e.g., a condensation reaction, of the hydroxyl groups with the silanol groups, forming M-O—Si bonds, where M represents a metal. Accordingly, exposure of a metallic component of the conductive element 100 to a coat-forming composition including a silane material, water, and, optionally, an alcohol, may accommodate reaction between the coat-forming composition and the surface of the metallic composition to form a coating on the metallic component where the coating has a coating composition including M-O—Si bonds, also referred to herein as "metal-oxygen-silicon bonds."

Both functional and non-functional silane materials may be formulated to react with metallic components, as described above. Examples of such a non-functional silane include, without limitation, a bis-[triethoxysilyl]ethane (BTSE) and a tetraethyl orthosilicate (TEOS) of the formula $Si—(OC_2H_5)_4$.

Functional silane materials may be formulated to be additionally reactive. For example, in embodiments in which the silane material of the coat-forming composition includes an alkoxy (e.g., methoxy, ethoxy) group, the alkoxy groups are hydrolyzable to form silanols that may react with the hydroxyl groups of metallic components of the conductive element 100. The hydroxyl groups of the metallic components may have been formed on the metallic components as described above. For example, without limitation, the alkoxy (e.g., methoxy, ethoxy) groups of the silane material in the coat-forming composition may be hydrolyzed to silanols as illustrated in the following example reactions:

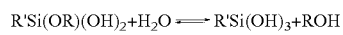

wherein R' and R represent hydrocarbons. The silanols may then react with metal hydroxides to form the M-O—Si bonds (metal-oxygen-silicon bonds) and water as illustrated in the following example reaction, wherein the dashed boundary illustrates a surface of a metal material of the conductive element 100:

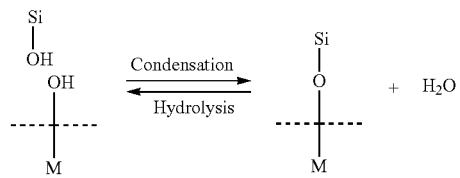

Examples of such alkoxy-including functional silane materials include, for example and without limitation, mono silanes such as y-aminopropyltriethyoxysilanes (y-APS), y-methacryloxypropyltriethoxysilanes (y-MPS), and y-glycidoxypropyltrimethoxysilanes (y-GPS), and bis silanes such as bis-[trimethoxysilylpropyl]amine (available under the name SILQUEST® A-1170 Silane from Crompton OSi Specialties), bis[3-triethoxysilylpropyl]tetrasulfide (available under the name SILQUEST® A-1289 Silane from Crompton OSi Specialties).

The silane material of the coat-forming composition may alternatively or additionally be formulated to include other functional groups. For example, and without limitation, a functional silane material including sulfur functional groups may react with metal within metallic components, forming M-S bonds, also referred to herein as "metal-sulfur bonds." For example, a sulfur group of a sulfur-based functional silane material may react with copper within a metallic component to form Cu—S bonds, i.e., "copper-sulfur bonds." Therefore, such formed coating 170 may have a coating composition including M-S bonds.

Silanol groups of a silane material, whether functional or non-functional, may also condense with one another during formation of the coating 170, forming Si—O—Si bonds, i.e., "silicon-oxygen-silicon bonds." The formation of the Si—O—Si bonds may increase the density and the viscosity of the coating material as the coating 170 forms. Therefore, the formed coating 170 may have a coating composition including Si—O—Si bonds.

Functional silanes may be formulated to also react with nonmetallic materials of the conductive element 100. For example, a functional silane material of a coating material may be formulated so that one or more functional groups within the functional silane material react with one or more functional groups within the substrate passivation material 126, e.g., a group within a polyimide-based substrate passivation material. The functional silane material may additionally or alternatively be formulated to react with a material within the substrate 120, within other nonmetallic components (not shown) of the conductive element 100, or within both if such materials are exposed to the coating material within the coat-forming composition during formation of the coating 170.

Accordingly, a coat-forming composition may be formulated (e.g., to include a non-functional silane material) so as to react with and form a bonded coating on only metallic materials of the conductive element 100 (e.g., the solder 130, the barrier material 114, and the conductive material 112). Alternatively, as illustrated in FIG. 1B, the coat-forming composition may be formulated (e.g., to include a functional silane material) so as to react with and form a bonded coating 170 on the metallic components of the conductive element 100 (e.g., the solder 130, the barrier material 114, and the conductive material 112) as well as on the nonmetallic components of the conductive element 100 (e.g., the substrate passivation material 126 and material of the semiconductor substrate 120, if regions of the semiconductor substrate 120 are otherwise exposed).

Because the coat-forming composition may be formulated to cover, react with, and form a bonded coating 170 on the outer surfaces of essentially all exposed materials of the conductive element 100 and semiconductor substrate 120, the coating 170 may form on and cover essentially all otherwise-exposed surfaces of the conductive element 100, i.e., the otherwise-exposed surfaces of the electrically conductive pillar 110, including the conductive material 112 and the barrier material 114, as well as the otherwise-exposed surfaces of the solder 130 and the substrate passivation material 126. Thus, the coating 170 may be a substantially continuous, substantially conformal coating in direct contact with the conductive material 112, the barrier material 114, the solder 130, and the substrate passivation material 126.

In other embodiments, the coat-forming composition may be formulated to cover some, but not all, of the otherwise-exposed surfaces of the solder 130 and the conductive material 112, or formulated to cover one of the solder 130 and the conductive material 112, but not both. In still other embodiments, select surfaces of the conductive element 100 may be exposed to the coat-forming composition to selectively form a non-continuous coating over one or more surfaces of the materials of the conductive element 100. In any regard, the coating 170 isolates the solder 130 from the conductive material 112.

In still other embodiments, a coating may be formed on only the solder 130 of the electrically conductive pillar 110. As such, the solder 130, when reflowed, may be inhibited from wicking or slumping along the conductive material 112.

In further other embodiments, a coating may be formed on conductive materials of the electrically conductive pillar 110 except the solder 130. That is, the coating, in such further embodiments, may be formed on the conductive material 112 and the barrier material 114 and not on the solder 130. Though the coating may not be formed on the solder 130, the coating on the conductive material 112 and the barrier material 114 nonetheless inhibits contact between the solder 130, e.g., after reflow, and the conductive material 112.

The coating 170 may be formed by exposing surfaces of one or more materials of the conductive element 100 desired to be covered to the coat-forming composition. The surfaces of the conductive element 100 may be exposed to the coat-forming composition within a coating solution, and the conductive element 100 may be dip coated, spin coated, spray coated, or otherwise covered with the coating solution.

Such a coating solution may include the coat-forming composition, a solvent, and, optionally, water. The solvent used in the coating solution may be a water-based solvent, i.e., a solvent miscible in water, or an organic solvent. For example, an organic solvent such as an alcohol (e.g., methanol, ethanol), in which the coat-forming composition is miscible, may be used to form the coating solution to be used to form the coating 170.

The solvent used in the coating solution may be selected such that the coating solution is formulated to discourage gelling of the coat-forming composition within the coating solution. As used herein, the term "gelling" means and includes thickening of the coating solution, increasing viscosity of the coating solution, and decreasing flowability of the coating solution prior to exposure of the conductive element 100 to the coating solution. For example, use of an alcohol (e.g., methanol, ethanol) as the solvent in a silane-including coating solution may discourage gelling of the silane material, accommodating flowability of the coating solution during application thereof on the conductive element 100.

In embodiments in which the coat-forming composition includes a silane material, the coat-forming composition further includes water, e.g., deionized water, to facilitate hydrolysis of the silane material to form the aforementioned reactive silanols. The presence of water within the coating solution may also facilitate formation of metal oxide and metal hydroxyl groups on the metallic materials of the conductive element 100 when the conductive element 100 is exposed to the coating solution. In other embodiments, the coating solution may be formed, initially, e.g., with the coat-forming composition in the solvent, in the absence of water, and the water may be introduced to the coating solution before the solution, e.g., the coat-forming composition and the solvent, are applied to the surfaces of the conductive element 100. In still other embodiments, the surfaces of the conductive element 100 may be first exposed to water and then exposed to the other components (e.g., coat-forming composition and solvent) of the coating solution.

The coating solution may be formed by adding the coat-forming composition (e.g., silane material) to the solvent (e.g., alcohol), and then adding water (e.g., deionized water). During and following addition of the chemicals to the coating solution, the solution may be stirred to inhibit gelling of the silane material.

The coating solution may be formulated to exhibit a pH in the range of about 4 to about 9 prior to application of the coating solution on the conductive element 100, which pH range may discourage gelling of the coat-forming composition (e.g., silane material). A coating solution with a pH lower than about 2 or about 3 or a pH greater than about 10, on the other hand, may facilitate gelling of the silane material before exposure of the conductive element 100 to the coating solution.

The coating solution may include from about 1% by volume to about 5% by volume coat-forming composition (e.g., silane material), based on the total volume of the coating solution. For example, without limitation, the coating solution may include about 5% by volume coat-forming composition (e.g., silane material), about 90% by volume ethanol or other alcohol-based solvent, and about 5% by volume deionized water.

Figure 1C:
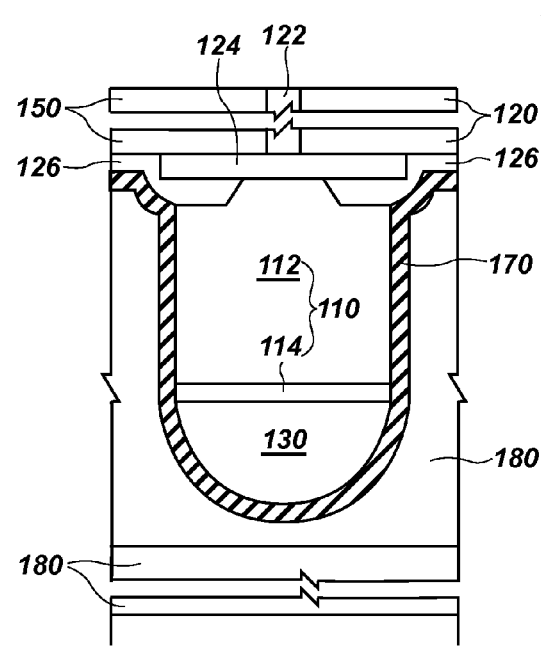
Figure 1D:
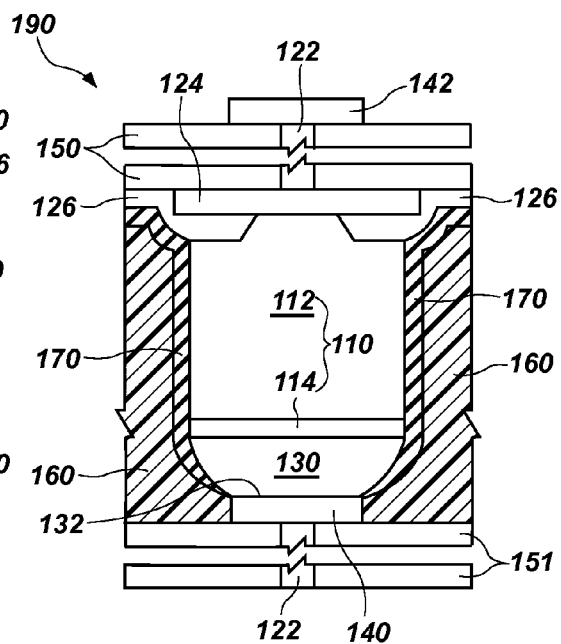

In some embodiments, such as that illustrated in FIGS. 1B through 1D, the coating 170 may have an essentially uniform thickness over the materials of the conductive element 100. In other embodiments (not shown), the coating 170 may be thicker in some areas, but relatively uniform over the majority of the conductive material 112. As used herein, "relatively uniform," in referring to thickness, means a thickness varying in height less than about 10% from one area of the coating to another area of the coating. In some embodiments, the coating 170 may have an average thickness of from about 50 nanometers to about 500 nanometers.

The average thickness of the coating 170 may be dependent upon the concentration of the coating material in the coating solution used to form the coating 170. For example, a coating solution with a higher concentration of silane material, relative to a solvent and, if present, other components of the coating solution, may result in a thicker coating 170 compared to a coating solution with a lower concentration of silane material. However, coating solutions of high concentrations of silane material may have a higher propensity to gel than those with lower concentrations of silane material. Therefore, the concentration of the coat-forming composition in the coating solution used to form the coating 170 may be tailored to achieve a coating 170 of a desired average thickness without excessive gelling. For example, and without limitation, a coating solution including about 5% by volume coat-forming composition (e.g., silane material), about 90% by volume ethanol or other alcohol-based solvent, and about 5% by volume deionized water may be tailored to produce a coating 170 with a thickness, averaged over all the coated components of the conductive element 100 or, alternatively or additionally, averaged over only the conductive material 112, of about 250 nanometers to about 500 nanometers. As another example, without limitation, a coating solution including about 2% by volume coating material (e.g., silane material) may be formulated to produce a coating 170 with an average thickness of about 80 nanometers to about 200 nanometers.

Application of such a coating solution may be self-limiting such that one application of the coating solution covers the exposed surfaces of the conductive element 100 to saturation. However, in some embodiments, multiple applications of the coating solution may be conducted to ensure formation of a continuous coating 170. Exposure of the conductive element 100 to the coating solution may be accomplished within a time frame of from about 30 seconds to about 1 minute, or longer if desired.

After exposure of the conductive element 100 to the coat-forming composition, either by way of direct exposure to the coat-forming composition or to a coating solution including the coat-forming composition, the coat-forming composition may be cured. The curing conditions may depend on the material used as the coat-forming composition. By way of example, the coating material may be cured at about 125° C. for about one hour to form the coating 170, providing a passivated conductive element 102.

Curing the coat-forming composition may encourage reaction and bonding between the coat-forming composition and metallic materials of the conductive element 100, and, depending on the formulation of the coat-forming composition, nonmetallic materials of the conductive element 100. Accordingly, in embodiments in which the coat-forming composition includes a functional silane material formulated to react with metallic and nonmetallic materials, the coat-forming composition may be cured to react the functional silane material with each of the conductive material 112, the barrier material 114, the solder 130, and the substrate passivation material 126. In such embodiments, for example, curing may encourage reaction and bonding between the functional groups of the functional silane material and each of the conductive material 112, barrier material 114, solder 130, and substrate passivation material 126 to form the coating 170 on and bonded to each of these materials.

In other embodiments, such as those in which the coat-forming composition includes a non-functional silane material, curing may encourage reaction and bonding between the non-functional silane material and each of the conductive material 112, barrier material 114, and solder 130, but not with the substrate passivation material 126. Nonetheless, the coating 170 may continue to be disposed over the substrate passivation material 126, though the coating 170 may not be bonded to the substrate passivation material 126.

In still other embodiments, such as those in which the coating 170 is not bonded to the substrate passivation material 126 or other nonmetallic material(s) of the conductive element 100 (if such other nonmetallic material or materials are present), the coating 170 may be treated to remove the non-bonded regions of the coating to produce a coating 170 over only the components to which the coating 170 is bonded, e.g., the metallic components of the conductive element 100.

It is contemplated that the coating 170 may coat essentially all materials otherwise exposed and supported by the substrate 120. In embodiments in which a functional silane material is used to form the coating 170, the coating may conformally overlie and be bonded to the electrically conductive pillar 110, the solder 130, and the substrate passivation material 126. In embodiments in which a non-functional silane material is used to form the coating 170, the coating 170 may conformally overlie and be bonded to the electrically conductive pillar 110 and the solder 130 and may also conformally overlie the substrate passivation material 126 but not be bonded to the substrate passivation material 126. Accordingly, in either case, the passivated conductive element 102, illustrated in FIG. 1B, is formed.

The semiconductor substrate 120 bearing the passivated conductive element 102 may then be further processed as illustrated in FIG. 1C. For example, the semiconductor substrate 120 may be inverted and supported by a conventional carrier material 180 or carrier materials 180 to accommodate further processing. The carrier material 180 or carrier materials 180 may include, for example and without limitation, a spin-coated thermoplastic, a spin-coated silicone, a polyimide, a silicone elastomer, a hydrocarbon thermoplastic, a cyclo-olefin, a high-temperature adhesive, or a combination thereof. The further processing may include thinning of the semiconductor substrate 120 by back-grinding or other process. This processing and thinning forms the semiconductor substrate 120 into what is referred to in the art as a "thinned" wafer. The thinned wafer may then be singulated into a number of semiconductor dice 150, each die 150 bearing a number of passivated conductive elements 102 on a major surface thereof. The previously referenced electrically conductive via 122, if present, extends through the thickness of the die 150 singulated from the thinned wafer. A die 150 may be brought into proximity with another die or other substrate 151, illustrated in FIG. 1D. The another die or other substrate 151 may support landing pads 140 with which the coated electrically conductive pillars 110 of the passivated conductive elements 102 of die 150 may be aligned for die attach.

During die attach, without removing any material from the coating 170, the solder 130 may be reflowed in proximity to the landing pad 140 of the another die or other substrate 151 to electrically and physically connect the electrically conductive pillar 110 of the die 150 with the conductive material of the landing pad 140 of the another die or other substrate 151. Flux may optionally be used for the solder 130 reflow without deteriorating the bonded coating 170. Alternatively, flux may not be used during the solder 130 reflow.

The solder 130 may be reflowed by heating the solder 130 above its melting point, and such heating may also beneficially deteriorate the coating 170 in the vicinity of the melted solder 130 proximate to the landing pad 140, enabling the solder 130 to contact the landing pad 140 at, for example, interface region 132. Accordingly, the electrically conductive pillar 110 of the die 150 becomes electrically and physically connected, also referred to herein as "soldered," with the landing pad 140 of the another die or other substrate 151, while the other materials of the conductive element 100 remain covered by the coating 170.

Alternatively, the solder 130 may be reflowed by heating the solder 130 above its melting point while the coated electrically conductive pillar 110 is brought into forced contact with the landing pad 140. The mechanical force, in addition to the heat, may break the coating 170 over the solder 130 in the vicinity of the landing pad 140, i.e., at interface region 132. Thus, as in the case of employing heat to break down the coating 170 over solder 130, the electrically conductive pillar 110 may be soldered to the landing pad 140 without first removing material from the coating 170 to expose the solder 130. In other embodiments, the electrically conductive pillar 110 may be soldered to the landing pad 140 after first removing material from the coating 170 to expose at least a portion of the solder 130.

During and after die attach, including solder reflow, the coating 170 may remain in place over the substrate passivation material 126, the conductive material 112, and the peripheral edges of barrier material 114. As illustrated in FIG. 1D, the coating 170 may also remain over a portion of the solder 130.

The coating 170 isolates at least the conductive material 112 from the solder 130 to prevent contact between the solder 130 and the coated components. Since the coating 170 is formed around the electrically conductive pillar 110, the solder 130 may be inhibited from wicking or slumping along the side of electrically conductive pillar 110, preventing the formation of intermetallic materials caused by the reaction of the solder 130 with the conductive material 112. Also, since the coating 170 may be formed from silane, the coating 170 may be hydrophobic and non-wettable, which may further inhibit the solder 130 from wicking or slumping along the coating 170. In some embodiments, even if the solder 130 should nonetheless flow along the electrically conductive pillar 110, the solder 130 may flow along the exterior surface of the coating 170, rather than between the coating 170 and the conductive materials within the electrically conductive pillar 110 (e.g., the conductive material 112 and the barrier material 114), inhibiting contact between the solder 130 and metallic materials of the passivated conductive element 102 (FIG. 1B).

Because the coating 170 may be chemically bonded to the materials of the electrically conductive pillar 110, unintentional separation between the coating 170 and, for example, the conductive material 112 of the electrically conductive pillar 110, may also be inhibited.

Still further, because the solder 130 may be reflowed and bonded to the landing pad 140 without prior removal of material from the coating 170, a processing step of exposing the solder 130 prior to solder reflow and die attach may be avoided.

During die attach, a dielectric underfill material 160 (FIG. 1D) may be added between the die 150 and the another die or other substrate 151. Coating 170 may enhance adhesion between the underfill material 160 and the coated materials of the resulting bonded semiconductor die assembly 190. As used herein, "underfill material" means and includes conventional between-die filler materials, including nonconductive paste, which underfill materials may provide mechanical support to the formed semiconductor die assembly 190. The underfill material 160 may include a silane coupling agent, e.g., a silane material including epoxy groups, amine groups, sulfur groups, or any combination thereof. The silane material of the underfill material 160 may not chemically react or bond with the components of the passivated conductive element 102 (FIG. 1B), however, not only because the materials will already be passivated by the coating 170, but because the underfill material 160 may not be introduced to the semiconductor die assembly 190 at conditions conducive for reaction between the silane material of the underfill material 160 and the materials of the passivated conductive element 102.

The similarity between a silane material in the underfill material 160 and the bonded silane material forming the coating 170 provides enhanced adhesion between the coating 170 and the underfill material 160. The resulting semiconductor die assembly 190 includes the coating 170 over the substrate passivation material 126, the conductive material 112, the barrier material 114, and at least partially over the solder 130 with enhanced adhesion between the underfill material 160 and the coated materials.

After die attach, another die, like die 150 of FIG. 1C, supporting another passivated conductive element, like passivated conductive element 102 of FIG. 1B, may be brought into proximity with another landing pad 142 on another side (e.g., a backside, if the conductive element 100 is supported by the active surface) of die 150. The another landing pad 142 may have been formed on die 150, in communication with the electrically conductive via 122 of die 150, during processing (e.g., backside processing) of die 150 before die attach. Accordingly, additional semiconductor dice 150 may be stacked and mutually attached, and additional underfill material 160 may be added therebetween, to form a stacked semiconductor die assembly comprising any suitable number of semiconductor dice.

With reference to FIGS. 2A through 2D, a conductive element 200 employed in a configuration referred to herein as a "pillar-on-pad" configuration may likewise be passivated according to the present disclosure. The pillar-on-pad configuration of the conductive element 200 is like the conductive element 100 of FIG. 1A with the exception that no substrate passivation material 126 (FIG. 1A) is disposed over the bond pad 124. The electrically conductive pillar 110 is supported entirely on the bond pad 124 and may be of the same lateral dimension as bond pad 124, as shown. Alternatively, the bond pad 124 may extend laterally beyond the electrically conductive pillar 110. With such configurations, extreme wicking or slumping of solder 130 before, during, or after die attach could bring the slumping or wicking solder into contact with the conductive material of the bond pad 124 and cause formation of intermetallic materials in or around the bond pad 124, corrosion of the bond pad 124, or other damage to the bond pad 124. However, in accordance with the present disclosure, a coating 270 may be formed over and be bonded to the otherwise-exposed surface(s) of the bond pad 124 to isolate and protect the bond pad 124 from contact with the solder 130 of the conductive element 200, as illustrated in FIG. 2B.

The coating 270 may be formed as described above with regard to FIG. 1B. However, in forming the coating 270, exposing the conductive element 200 to the coat-forming composition (e.g., the coat-forming composition within the coating solution) includes exposing a surface of the substrate 120, e.g., an active surface of the substrate 120, and a surface or surfaces of the bond pad 124 to the coating material as well as exposing surfaces of the conductive material 112, the barrier material 114, and the solder 130 to the coating material.

The coat-forming composition may be formulated to react with the metallic material of the bond pad 124 such that the resulting coating 270 is bonded to the otherwise-exposed surface of the bond pad 124. The bond pad 124 may include hydroxyl groups on its sidewalls due to exposure of the sidewalls to oxygen, to water, or to both, which hydroxyl groups may react with and bond to silanol or other functional groups within a non-functional or functional silane material within the coat-forming composition to form the coating 270 on the surfaces of the bond pad 124.

Alternatively or additionally, the coat-forming composition may be formulated to react with the material of the substrate 120, e.g., silicon within the substrate 120. Such a coat-forming composition may be formulated to react with silicon oxides, e.g., native oxide, on the exposed surface of the substrate 120. For example, and without limitation, the coat-forming composition may include a silane material that has been hydrolyzed to form silanol groups reactive with silicon of the substrate 120.

Accordingly, the coating 270 may be formed over essentially all otherwise-exposed surfaces of the components of the conductive element 200. The resulting, passivated conductive element 202 may then be inverted, supported by one or more conventional carrier materials 180, as illustrated in FIG. 2C, and further processed, e.g., thinned, to prepare a thinned wafer, and then singulated to prepare semiconductor dice 150, each bearing a number of passivated conductive elements 202 on a major surface thereof. As described with regard to FIG. 1D, die 150 may be aligned with another die or other substrate 151, and the solder 130 reflowed to attach the die 150 to the another die or other substrate 151, forming a bonded conductive element, i.e., semiconductor die assembly 290. To accomplish the die attach, material may not be removed from the coating 270 before solder reflow and bonding. Rather, heating the solder 130 may also beneficially deteriorate the coating 270 in the vicinity of the landing pad 140 to allow direct, physical contact between the reflowed solder 130 and the landing pad 140 at, for example, interface region 132.

In other embodiments, die attach may include mechanically-forced contact between the passivated conductive element 202 and the landing pad 140 of the another die or substrate 151, e.g., die attach by thermal compression bonding. The mechanical force may thin or break the coating 270 in the vicinity of the landing pad 140 to allow contact between the solder 130 of die 150 and the landing pad 140 of the another die or other substrate 151. Accordingly, a processing step of removing material from the coating 270, such as to expose a surface of the solder 130 before the die attach, may be avoided.

Again, an underfill material 160 may be included between the die 150 and the another die or other substrate 151, and the coating 270 may encourage adhesion between the electrically conductive pillar 110 and the underfill material 160. In some embodiments, the underfill material 160 may be included between the die 150 and the another die or other substrate 151 before reflow of the solder 130. Further, because the coating 270 isolates the solder 130 from the conductive material 112 and from the bond pad 124, the coating 270 may also inhibit deterioration of the electrically conductive pillar 110 and deterioration of the bond pad 124 without use of a substrate passivation material 126 (e.g., FIGS. 1A through 1D). The coating 270 may also inhibit wicking or slumping of the solder 130 because the coating 270 remains at least partially over sides of the solder 130, even after die attach. Even should the solder 130 slump or wick, the coating 270 remaining over the sidewalls of the conductive material 112, the barrier material 114, and the bond pad 124 inhibits contact between the wicking or slumping solder and the coated components.

Figure 3A:
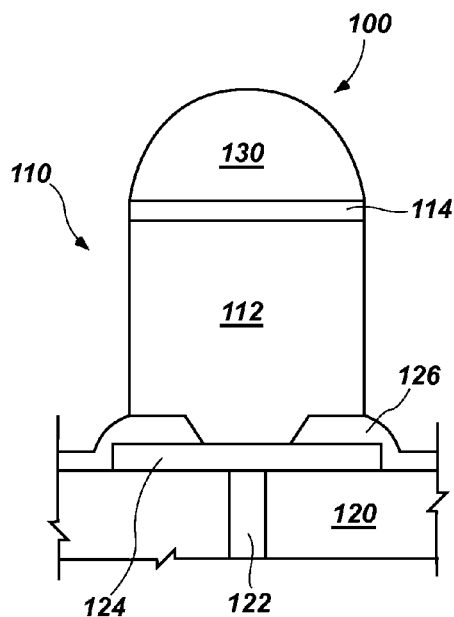
FIGS. 3A through 3D are cross-sectional elevation views of a semiconductor structure of a pillar-on-passivation configuration during various stages of a bonding method according to an embodiment of the present disclosure.
Figure 3B:
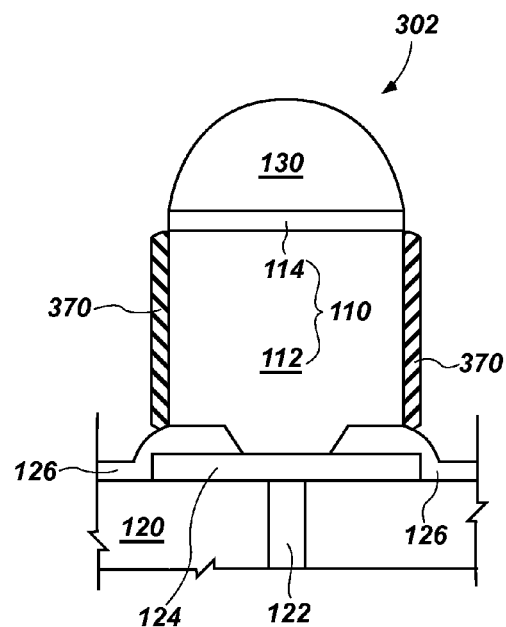

Another embodiment of the present disclosure is illustrated in FIGS. 3A through 3D. The illustrated pillar-on-passivation conductive element 100 may be selectively coated with a coating material selective for the conductive material 112 of the electrically conductive pillar 110, as illustrated in FIG. 3B. In embodiments in which the conductive material 112 includes or consists essentially of copper, either on the outer surface of the conductive material 112 or throughout the conductive material 112, the coating material may be selective for copper. The selective coating material forms a selective coating 370 over essentially only sidewalls of one or more, but not all, components of the conductive element 100. For example, without limitation, the selective coating material may be formulated to form the selective coating 370 on only the conductive material 112.

For example, and without limitation, the selective coating material may include an organic solderability protectant (or preservative) material, generally known in the art as an "OSP." The OSP may include, for example and without limitation, a benzotriazole, an imidazole, or a combination thereof. The OSP may be selective for the metal of the conductive material 112 and be formulated to inhibit oxidation of the conductive material 112 on which the selective coating 370 is formed. The OSP may also be formulated to be resistant to high temperatures, e.g., formulated to withstand temperatures up to about 250° C., e.g., 220° C., without deteriorating.

Some conventional OSPs are vulnerable to deterioration in the presence of conventional flux materials. Accordingly, flux may or may not be used during die attach following formation of the selective coating 370 depending on the OSP chosen. However, some conventional OSPs are formulated to be less vulnerable to flux materials, such that flux may be used during die attach. In either regard, flux may be used during an initial reflow of the solder 130, prior to formation of the selective coating 370, such as to achieve the solder 130 of a rounded shape, as illustrated in FIG. 3A.

Figure 3C:
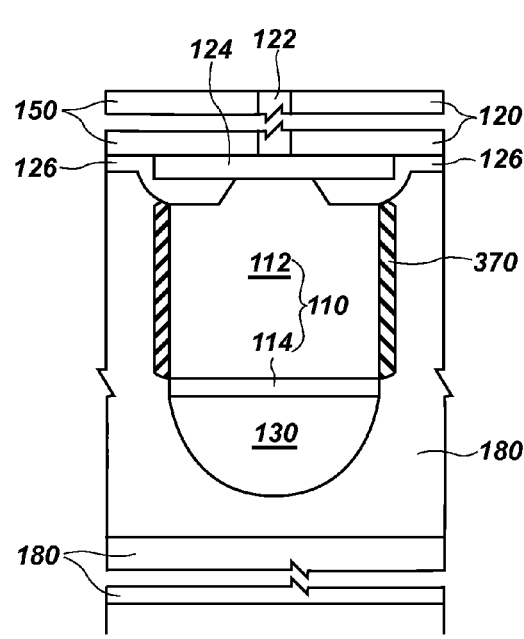
Figure 3D:
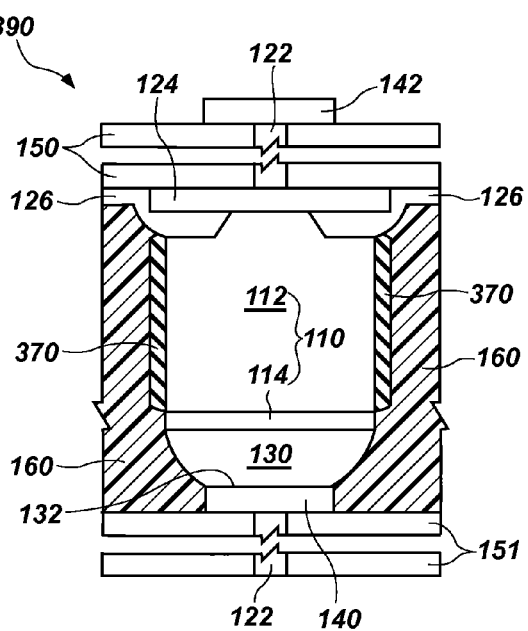

The passivated conductive element 302 may then be processed, as illustrated in FIG. 3C. During processing and subsequent die attach, as illustrated in FIG. 3D, the selective coating 370 isolates the conductive material 112 from the solder 130. Therefore, if the solder 130 should slump or begin to wick along the electrically conductive pillar 110, the selective coating 370 inhibits the solder 130 from coming into contact with the conductive material 112 of the bonded conductive element, i.e., semiconductor die assembly 390. Further, because the selective coating 370 forms substantially only on the conductive material 112, removing material from the selective coating 370 to expose a portion of the solder 130 before soldering the electrically conductive pillar 110 to the landing pad 140 may be avoided. The resulting bonded conductive element, i.e., semiconductor die assembly 390, includes the selective coating 370 along the sidewalls of the conductive material 112. The selective coating 370 may enhance adhesion with the underfill material 160.

Figure 4A:
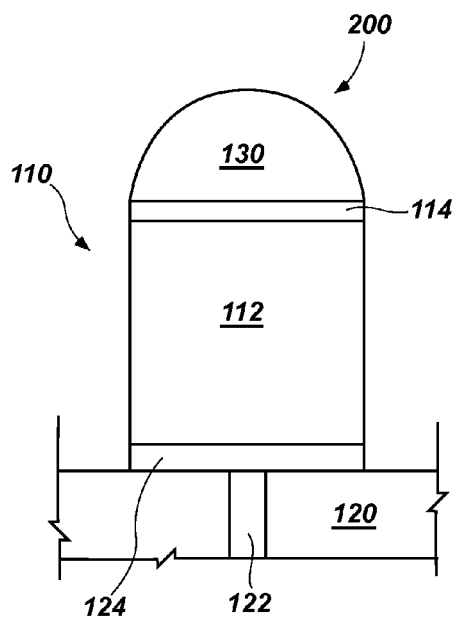
FIGS. 4A through 4D are cross-sectional elevation views of a semiconductor structure of a pillar-on-pad configuration during various stages of a bonding method according to an embodiment of the present disclosure.
Figure 4B:
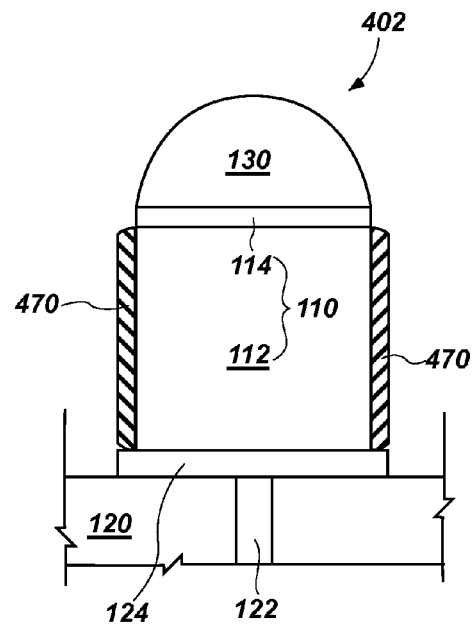
Figure 4C:
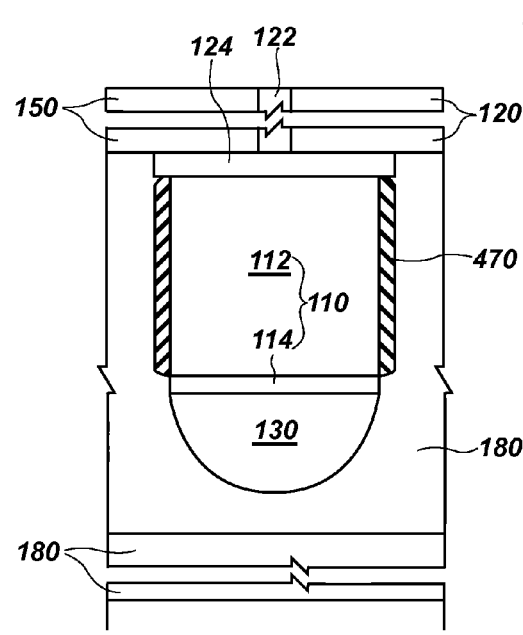
Figure 4D:
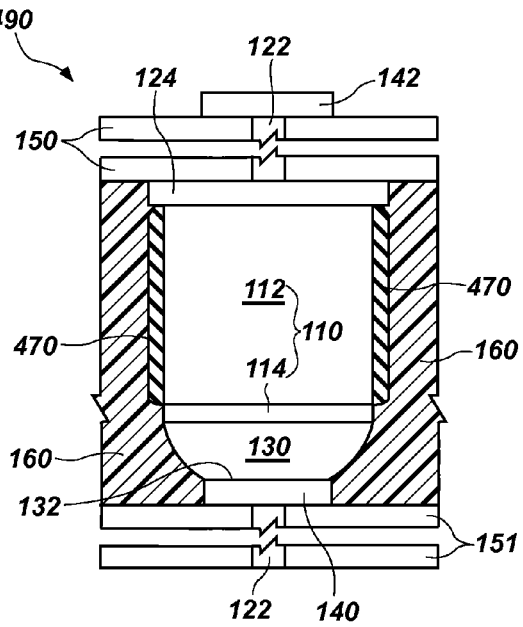

As illustrated in FIGS. 4A through 4D, a selective coating 470 may also be used with a conductive element 200 of a pillar-on-pad configuration. As illustrated in FIG. 4B, because the selective coating 470 is selective for the conductive material 112, the selective coating 470 is formed essentially only on sidewalls of the conductive material 112, leaving the passivated conductive element 402 with the sidewalls of the bond pad 124 and the surface of the substrate 120 exposed in addition to the sidewalls of the barrier material 114 and the surface of the solder 130. The passivated conductive element 402 may thereafter be processed, as illustrated in FIG. 4C, and attached to the first die 151, as illustrated in FIG. 4D. Again, because the selective coating 470 forms essentially only on the conductive material 112, removing material from the selective coating 470 to expose the solder 130 to the landing pad 140 may be avoided. The resulting bonded conductive element, i.e., semiconductor die assembly 490, includes the selective coating 470 along the sidewalls of the conductive material 112.

Figure 5A:
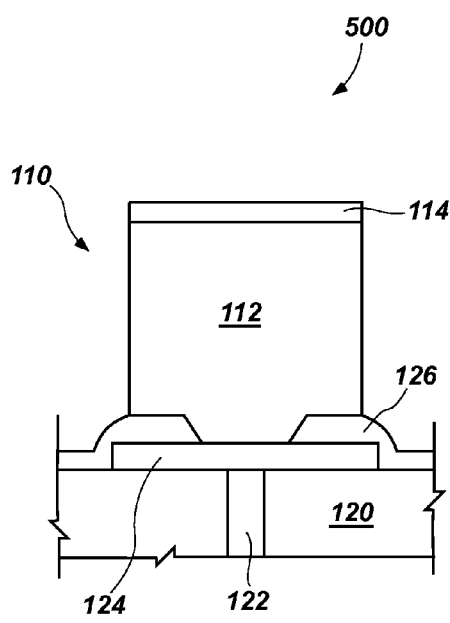
FIGS. 5A through 5D are cross-sectional elevation views of a semiconductor structure of a pillar-on-passivation configuration during various stages of a bonding method according to an embodiment of the present disclosure.
Figure 5B:
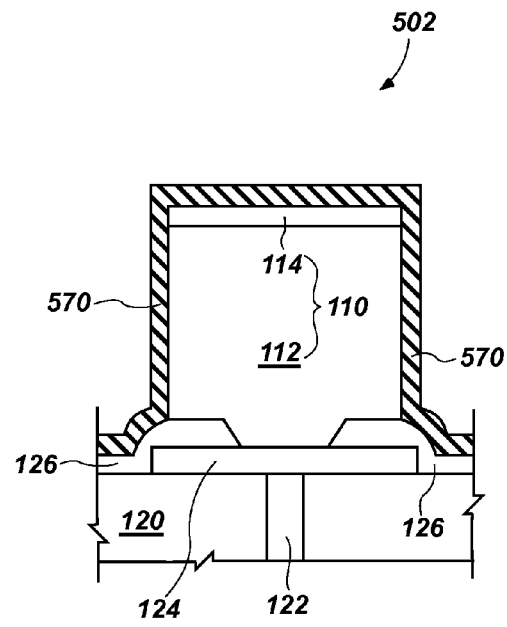

Another embodiment is illustrated in FIGS. 5A through 5D. As illustrated in FIG. 5A, the electrically conductive pillar 110 of a conductive element 500 may not initially support a solder mass, unlike the electrically conductive pillars 110 of FIGS. 1A, 2A, 3A, and 4A. (Though FIG. 5A illustrates the electrically conductive pillar 110 in a pillar-on-passivation configuration, the electrically conductive pillar 110 may alternatively be in a pillar-on-pad configuration.) The electrically conductive pillar 110 may be coated with a coating 570 formed from a coating material, e.g., a silane-including coating material, as described above with regard to FIGS. 1A through 2D. In embodiments in which the coating material includes a silane material, either non-functional or functional, the coating 570 may be formed over the conductive material 112 and barrier material 114. In pillar-on-passivation configuration embodiments in which the coating material includes a silane material that is functional, the coating 570 may also be formed over the substrate passivation material 126, as illustrated in FIG. 5B. In pillar-on-pad configurations (e.g., like that of FIG. 2B) in which the coating material includes a silane material that is functional, the coating may formed over the otherwise-exposed surface(s) of the bond pad 124 and the substrate 120 as well as on other metallic materials of the electrically conductive pillar 110.

Figure 5C:
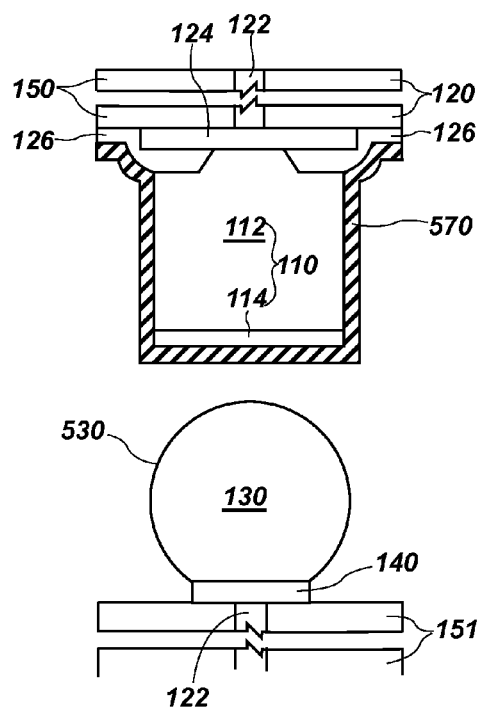

The resulting passivated conductive element 502, illustrated in FIG. 5B, may then be inverted and brought into proximity with a solder ball 530 made up of the solder 130, as illustrated in FIG. 5C, supported by a landing pad 140 on another die or other substrate 151. Reflowing the solder 130 of the solder ball 530 in proximity with the electrically conductive pillar 110, either with force or without force, may break down the coating 570 disposed between the barrier material 114 and the solder 130 to bring the barrier material 114 and solder 130 into physical contact with one another so as to solder the electrically conductive pillar 110 to the landing pad 140. Alternatively, heating the solder 130 to reflow the solder 130 may also heat and deteriorate the coating 570 where it is in contact with solder 130, such that the section of the coating 570 breaks down and allows bonding of the electrically conductive pillar 110 to the landing pad 140. Removing material from the coating 570 prior to solder reflow may be avoided. In other embodiments, however, material may be removed from the coating 570 prior to solder reflow to expose at least a portion of the electrically conductive pillar 110 to the solder 130 of the solder ball 530.

Figure 5D:
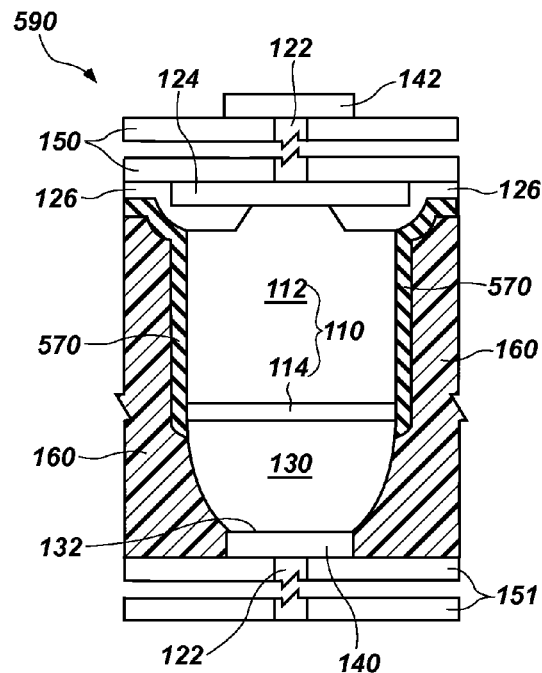

As illustrated in FIG. 5D, the resulting bonded conductive element, i.e., semiconductor die assembly 590, includes the coating 570 on each of the barrier material 114, conductive material 112, and substrate passivation material 126, but not substantially on the solder 130. In embodiments in which the conductive element 500 was of a pillar-on-pad configuration (like that of FIG. 2D), the resulting bonded conductive element (not shown) may include the coating on each of the barrier material 114, the conductive material 112, the bond pad 124, and the substrate 120 (e.g., a front side of die 150, as in the embodiment of FIG. 2D).

Further, though not shown, a selective coating, like the selective coating 370 of FIGS. 3B through 3D or the selective coating 470 of FIGS. 4B through 4D, may alternatively be formed as described above with regard to FIGS. 3B through 3D or FIGS. 4B through 4D, on a conductive element 500 of either the illustrated pillar-on-passivation configuration or a pillar-on-pad configuration. The resulting bonded die assembly would include a coating on essentially only the conductive material 112.

Though FIGS. 1A through 5D illustrate only a single electrically conductive pillar 110, it is contemplated, as noted above, that in practice one die 150 supports a plurality, even hundreds, of electrically conductive pillars 110 and that multiple dice 150 may be stacked to form a stacked semiconductor die assembly, as illustrated in FIGS. 6 through 10. Therefore, an additional semiconductor die 152, supporting a plurality of passivated conductive elements (e.g., passivated conductive elements 102, 202, 302, 402, 502) may be stacked atop the die 150, as illustrated in FIGS. 6 through 10. Likewise, a fourth, fifth, or so on die may be so stacked.

Figure 6:
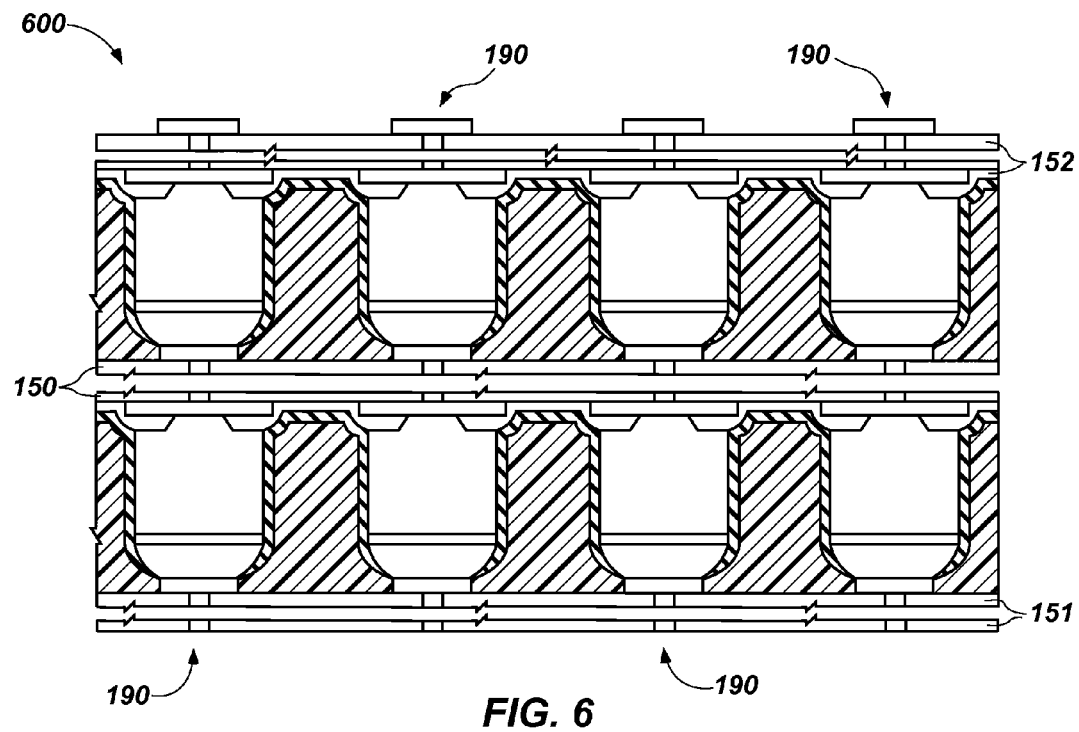
FIG. 6 is a cross-sectional elevation view of a stacked semiconductor die assembly formed according to the bonding method of FIGS. 1A through 1D.

FIG. 6 illustrates such a stacked array 600 comprising a plurality of bonded conductive elements, i.e., semiconductor die assemblies 190, which may have been formed in accordance with the method illustrated in FIGS. 1A through 1D.

Figure 7:
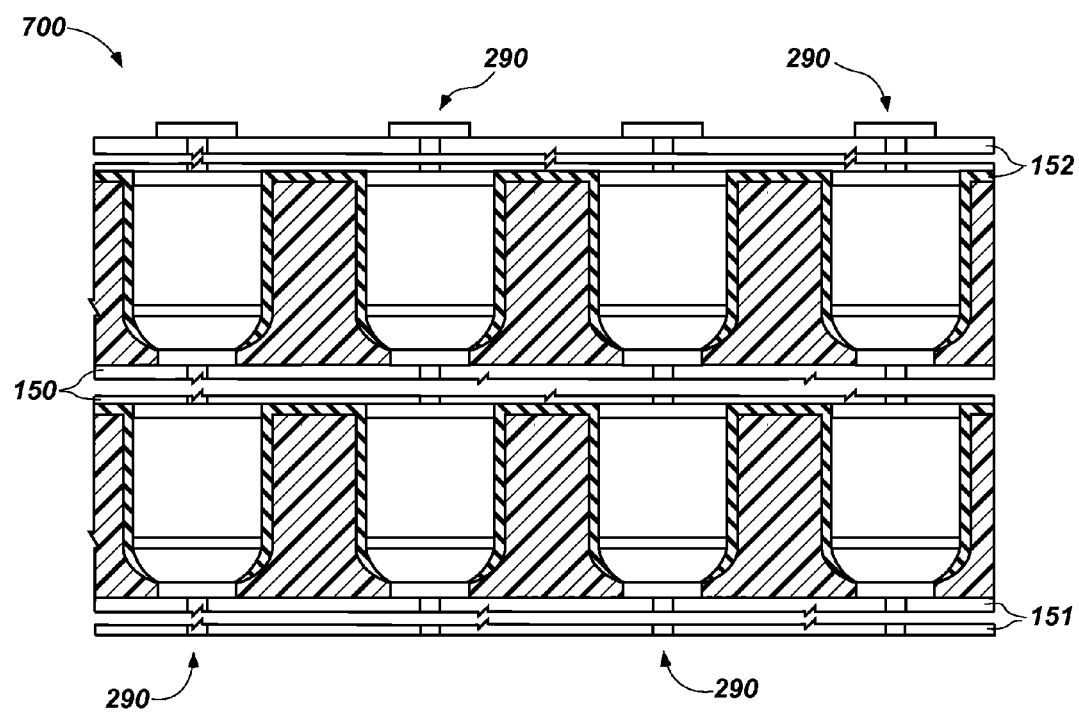
FIG. 7 is a cross-sectional elevation view of a stacked semiconductor die assembly formed according to the bonding method of FIGS. 2A through 2D.

FIG. 7 illustrates a stacked array 700 comprising a plurality of bonded conductive elements, i.e., semiconductor die assemblies 290, which may have been formed in accordance with the method illustrated in FIGS. 2A through 2D.

Figure 8:
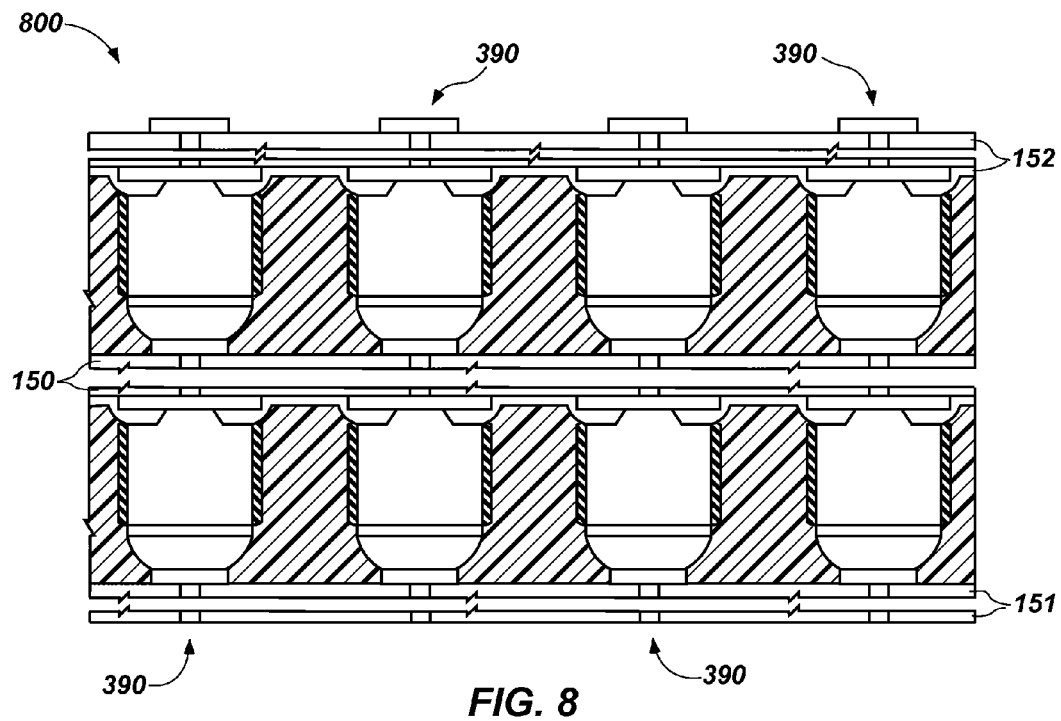
FIG. 8 is a cross-sectional elevation view of a stacked semiconductor die assembly formed according to the bonding method of FIGS. 3A through 3D.

FIG. 8 illustrates a stacked array 800 comprising a plurality of bonded conductive elements, i.e., semiconductor die assemblies 390, which may have been formed in accordance with the method illustrated in FIGS. 3A through 3D.

Figure 9:
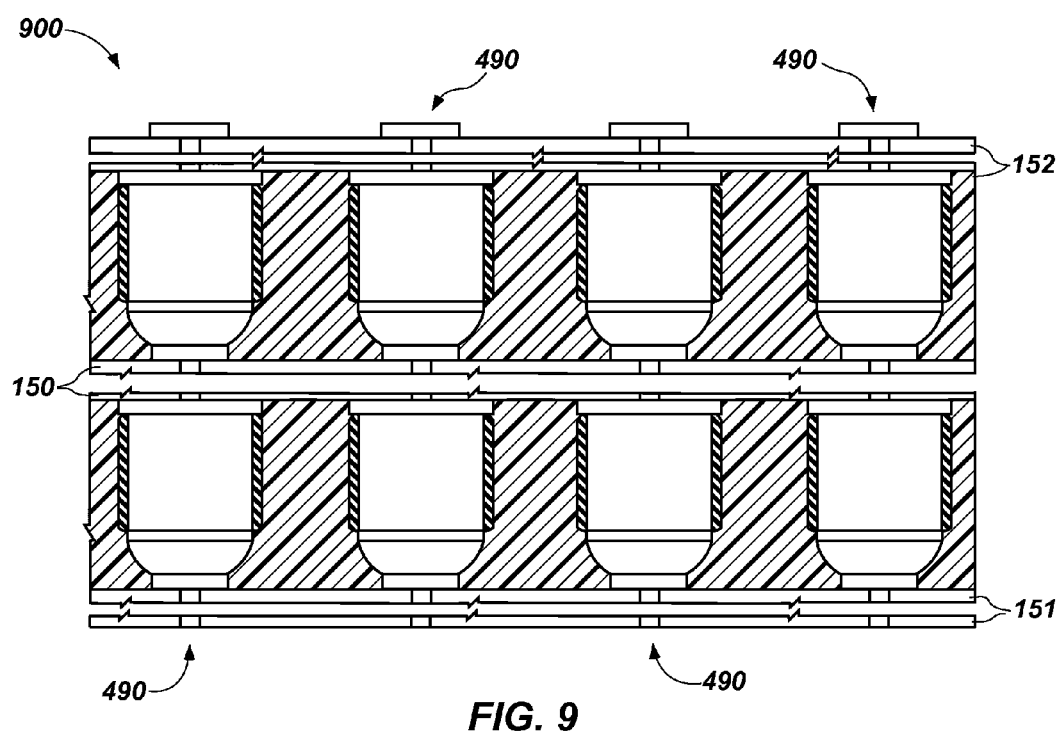
FIG. 9 is a cross-sectional elevation view of a stacked semiconductor die assembly formed according to the bonding method of FIGS. 4A through 4D.

FIG. 9 illustrates a stacked array 900 comprising a plurality of bonded conductive elements, i.e., semiconductor die assemblies 490, which may have been formed in accordance with the method illustrated in FIGS. 4A through 4D.

Figure 10:
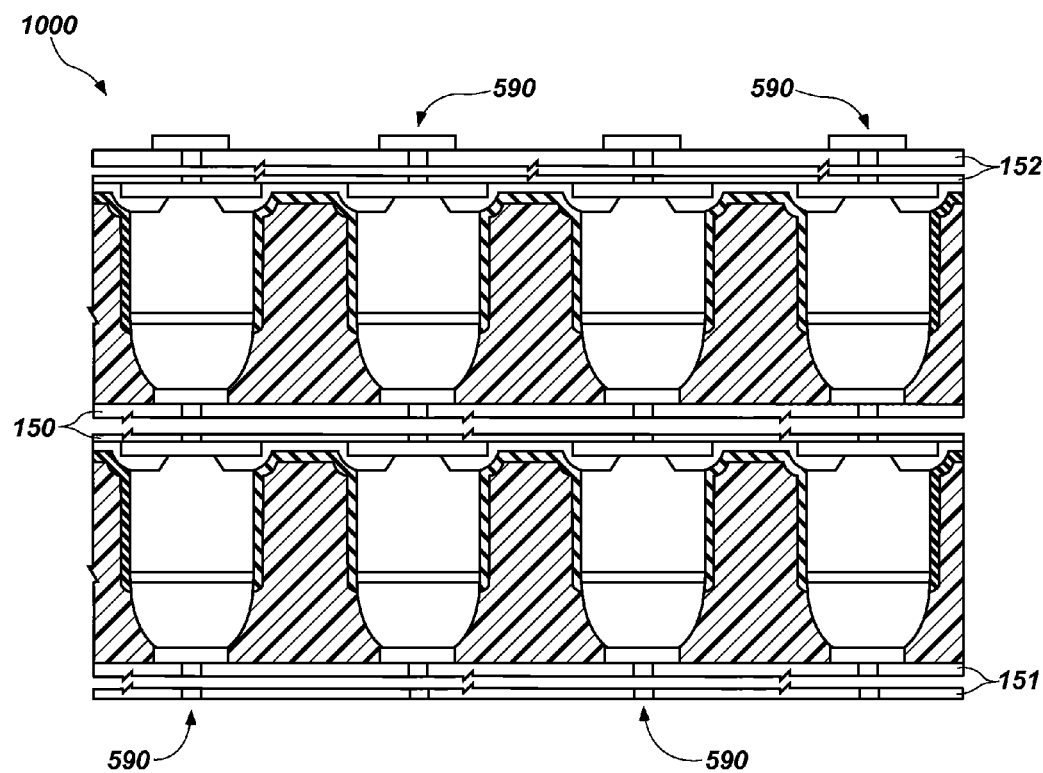
FIG. 10 is a cross-sectional elevation view of a stacked semiconductor die assembly formed according to the bonding method of FIGS. 5A through 5D.

FIG. 10 illustrates a stacked array 1000 comprising a plurality of bonded conductive elements, i.e., semiconductor die assemblies 590, which may have been formed in accordance with the method illustrated in FIGS. 5A through 5D.

Alternatively, in embodiments in which the coating is applied prior to solder reflow for die attach, the bonded conductive element may be again exposed to the coating material after solder reflow and die attach, but before inclusion of the underfill material 160. This second exposure to the coating material (e.g., to the coating material within a coating solution) may re-coat any surfaces of the bonded conductive elements that became exposed, i.e., uncoated, during processing between the initial coating formation and completion of the die attach. In such embodiments, the resulting bonded conductive element, following second or subsequent exposure to the coating material, may further include the coating over otherwise-exposed surfaces of the landing pad 140 and the non-active surface, e.g., backside, of the another die or other substrate 151. Therefore, the coating may also enhance adhesion between the subsequently-included underfill material 160 and the landing pad 140 and the another die or other substrate 151.

As described above, disclosed is a method of forming a semiconductor die assembly, comprising forming a coating on an electrically conductive pillar, comprising exposing at least a portion of the electrically conductive pillar to at least one of a silane material and an organic solderability protectant material. Solder is reflowed between the electrically conductive pillar and a landing pad to electrically and physically connect the electrically conductive pillar to the landing pad without removing material from the coating.

Also disclosed is a method of forming a semiconductor die assembly, comprising forming a coating on solder of an electrically conductive pillar. The coating is formed from at least one of a silane material and an organic solderability protectant material. Without removing material from the coating, a conductive material of the electrically conductive pillar is attached to a landing pad by reflowing the solder.

Still further is disclosed a semiconductor assembly, comprising a conductive element on a semiconductor substrate. Solder electrically connects the conductive element to a landing pad of another substrate. The semiconductor assembly also comprises a coating on the conductive element and at least partially on the solder. The coating comprises at least one of metal-oxygen-silicon bonds, silicon-oxygen-silicon bonds, metal-sulfur bonds and silicon bonds, and an organic solderability protectant material.

Additionally, disclosed is a structure, comprising a conductive material disposed over a substrate and supporting a solder mass. A coating is bonded to the conductive material and isolates an exterior surface of the conductive material from the solder mass. The coating comprises at least one of an organic solderability protectant material and silicon bonded to oxygen.

Moreover, disclosed is a structure, comprising a conductive material disposed over a substrate. A coating is bonded to the conductive material. The coating comprises at least one of an organic solderability protectant material and silicon-to-oxygen bonds.

While the disclosed device structures and methods are susceptible to various modifications and alternative forms in implementation thereof, specific embodiments have been shown by way of example in the drawings and have been described in detail herein. However, it should be understood that the present disclosure is not intended to be limited to the particular forms disclosed. Rather, the present invention encompasses all modifications, combinations, equivalents, variations, and alternatives falling within the scope of the following appended claims and their legal equivalents.

What is claimed is:

1. A semiconductor assembly, comprising:
   a conductive element on a semiconductor substrate;
   solder electrically connecting the conductive element to a landing pad of another substrate; and
   a coating on the conductive element and substantially conforming to and fully covering an at least partially rounded exterior surface of the solder, the coating comprising at least one of metal-oxygen-silicon bonds, silicon-oxygen-silicon bonds, metal-sulfur bonds and silicon bonds, and an organic solderability protectant material.

2. The semiconductor assembly of claim 1, wherein the coating also substantially conforms to the conductive element.

3. The semiconductor assembly of claim 1, wherein the conductive element contacts a bond pad, and the coating is further on the bond pad.

4. The semiconductor assembly of claim 3, wherein the coating fully covers sidewalls of the bond pad.

5. The semiconductor assembly of claim 1, wherein the coating is bonded to the solder.

6. The semiconductor assembly of claim 1, wherein the coating is formed from a silane material.

7. A structure, comprising:
   a conductive material disposed over a substrate and supporting a solder mass;
   a barrier material disposed between the conductive material and the solder mass: and
   a coating bonded to the conductive material and to the barrier material and isolating an exterior surface of the conductive material and an exterior surface of the barrier material from the solder mass, the coating substantially conforming to and extending along a rounded exterior surface of the solder mass from the barrier material to a landing pad, the coating comprising at least one of:
   an organic solderability protectant material, and
   silicon bonded to oxygen.

8. The structure of claim 7, wherein the coating is bonded to the conductive material, the barrier material, and the solder mass.

9. The structure of claim 7, wherein the coating is bonded to the conductive material by at least one of metal-oxygen-silicon bonds and metal-sulfur bonds.

10. The structure of claim 7, wherein the coating comprises the silicon bonded to oxygen.

11. The structure of claim 10, wherein the coating is formed from a silane material.

12. The structure of claim 7, further comprising a substrate passivation material at least partially overlying a bond pad on the substrate, wherein the coating is at least partially disposed on the substrate passivation material.

13. A structure, comprising:
   a conductive material disposed directly on a bond pad over a semiconductor substrate without a passivation material on the bond pad;
   a coating bonded to the conductive material and substantially conforming to a rounded surface of a solder mass overlying the conductive material, the coating comprising at least one of an organic solderability protectant material and silicon-to-oxygen bonds; and
   a dielectric underfill material on the coating,
   at least one of the coating and the dielectric underfill material in physical contact with the semiconductor substrate.

14. The structure of claim 13, further comprising:
   a barrier material disposed over an end of the conductive material,
   wherein the coating is bonded to the conductive material and the barrier material.

15. The structure of claim 13, wherein the coating is bonded to the conductive material by at least one of metal-oxygen-silicon bonds and metal-sulfur bonds.

16. The structure of claim 13, wherein the coating is also bonded to the bond pad.

* * * * *

UNITED STATES PATENT AND TRADEMARK OFFICE
CERTIFICATE OF CORRECTION

| | | |
|---|---|---|
| PATENT NO. | : 8,970,034 B2 | Page 1 of 1 |
| APPLICATION NO. | : 13/467465 | |
| DATED | : March 3, 2015 | |
| INVENTOR(S) | : Jaspreet S. Gandhi | |

It is certified that error appears in the above-identified patent and that said Letters Patent is hereby corrected as shown below:

In the Claims

In column 20, line 9, in Claim 7, delete "mass:" and insert -- mass; --, therefor.

Signed and Sealed this
Twenty-first Day of July, 2015

Michelle K. Lee
*Director of the United States Patent and Trademark Office*